(12) United States Patent
Murata (10) Patent No.: US 8,243,768 B2
(45) Date of Patent: Aug. 14, 2012

(54) SEMICONDUCTOR DIFFRACTION GRATING DEVICE AND SEMICONDUCTOR LASER

(75) Inventor: Michio Murata, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/902,526

(22) Filed: Oct. 12, 2010

(65) Prior Publication Data

US 2011/0090931 A1 Apr. 21, 2011

(30) Foreign Application Priority Data

Oct. 20, 2009 (JP) ................................. 2009-241691

(51) Int. Cl.
*H01S 3/10* (2006.01)
*H01S 5/00* (2006.01)
(52) U.S. Cl. ........................................ 372/50.11; 372/20
(58) Field of Classification Search ............... 372/50.11, 372/20
See application file for complete search history.

(56) References Cited

U.S. PATENT DOCUMENTS

| 5,379,318 A | * | 1/1995 | Weber | 372/96 |
| 5,838,714 A | * | 11/1998 | Delorme | 372/96 |
| 7,145,923 B2 | | 12/2006 | Carter et al. | |

* cited by examiner

*Primary Examiner* — Patrick Stafford
(74) *Attorney, Agent, or Firm* — Smith, Gambrell & Russell, LLP (57) ABSTRACT

A semiconductor diffraction grating device includes a semiconductor substrate having a principal surface, a semiconductor core layer and a semiconductor cladding layer provided on the principal surface, and a chirped grating structure provided between the semiconductor core layer and the semiconductor cladding layer. The chirped grating structure includes a first region, a second region, and a third region arranged in that order in a predetermined axis direction, the first, second, and third regions including a plurality of projections constituting a chirped grating. The plurality of projections are provided at placement positions arranged with a predetermined pitch in the predetermined axis direction. The coupling coefficient κ of the chirped grating monotonically increases in the predetermined axis direction to a predetermined value in the first region, remains flat in the second region, and monotonically decreases in the predetermined axis direction from the predetermined value in the third region.

12 Claims, 8 Drawing Sheets

SEMICONDUCTOR DIFFRACTION GRATING DEVICE AND SEMICONDUCTOR LASER

BACKGROUND OF THE INVENTION

1. Field of the Invention

The present invention relates to a semiconductor diffraction grating device and a semiconductor laser.

2. Description of the Related Art

Patent Document 1 (U.S. Pat. No. 7,145,923) describes a tuneable laser. The tuneable laser includes a reflecting section including a distributed Bragg reflector, a chirped grating section, and a gain section disposed between the reflecting section and the chirped grating section. In the chirped grating section, a chirped grating is formed such that the grating pitch monotonically increases along the length. Furthermore, the chirped grating has a sinusoidal waveform with constant amplitude.

SUMMARY OF THE INVENTION

According to the above-mentioned document, the reflection spectrum of the chirped grating is characterized in that the reflectivity is substantially flat in the wavelength band in the center region, and the reflectivity smoothly decreases in the vicinity of the boundaries between the wavelength band in the center region and the wavelength bands at both ends.

However, the present inventors have performed detailed verification, and it has become clear that, in the reflection spectrum of a known chirped grating such as the one described above, relatively large fringes occur in the vicinity of the boundaries between the wavelength band in the center region and the wavelength bands at both ends.

A semiconductor diffraction grating device according to the present invention includes a semiconductor substrate having a principal surface, a semiconductor core layer and a semiconductor cladding layer provided on the principal surface of the semiconductor substrate, and a chirped grating structure provided between the semiconductor core layer and the semiconductor cladding layer. The chirped grating structure includes a first region, a second region, and a third region arranged in that order in a predetermined axis direction, and the first region, the second region, and the third region include a plurality of projections constituting a chirped grating. The plurality of projections are provided at placement positions arranged with a predetermined pitch in the predetermined axis direction. The coupling coefficient κ of the chirped grating monotonically increases in the predetermined axis direction to a predetermined value in the first region, remains flat in the second region, and monotonically decreases in the predetermined axis direction from the predetermined value in the third region.

In the semiconductor diffraction grating device of the present invention, since the coupling coefficient κ of the chirped grating remains flat in the second region, the reflection spectrum of the semiconductor diffraction grating device has a wavelength band in which the reflectivity is substantially flat. Meanwhile, the second region is disposed between the first region and the third region. The coupling coefficient κ of the chirped grating monotonically increases in the first region, and monotonically decreases in the third region. As a result, in the semiconductor diffraction grating device of the present invention, it is possible to achieve a reflection spectrum in which the fringes are reduced in size in the vicinity of the boundaries between the wavelength band having a substantially flat reflectivity and the wavelength bands at both ends thereof.

In the semiconductor diffraction grating device according to the present invention, preferably, the first region includes the projections whose height monotonically increases in the predetermined axis direction, and the third region includes the projections whose height monotonically decreases in the predetermined axis direction.

In this case, the height of the projections monotonically increases in the predetermined axis direction in the first region, and the height of the projections monotonically decreases in the predetermined axis direction in the third region. Therefore, it is possible to reliably set the coupling coefficient κ of the chirped grating so as to monotonically increase in the first region and to monotonically decrease in the third region.

Alternatively, in the semiconductor diffraction grating device according to the present invention, preferably, at least one position among the placement positions in the first region is not provided with a projection for the chirped grating, and at least one position among the placement positions in the third region is not provided with a projection for the chirped grating.

In this case, by not providing projections at predetermined positions among placement positions in the first and third regions, it is possible to set the coupling coefficient κ of the chirped grating so as to monotonically increase in the first region and to monotonically decrease in the third region even if the height of the projections is constant. In this case, since the change in the coupling coefficient κ in the first and third regions is adjusted by not providing projections at predetermined positions, the device can be easily fabricated in comparison with the case where the heights of the projections in the first and third regions are changed.

Furthermore, preferably, the placement positions not provided with projections in each of the first region and the third region are not periodic in the array of placement positions for the plurality of projections. In this case, it is possible to suppress large changes in reflectivity due to the regularity of thinning of projections.

Furthermore, the plurality of projections formed in the first region, the second region, and the third region may have a substantially constant height over the first region, the second region, and the third region.

Furthermore, in the semiconductor diffraction grating device according to the present invention, preferably, the ratio of the sum of the length of the first region and the length of the third region to the overall length of the chirped grating structure is greater than or equal to 0.1 and smaller than or equal to 0.2.

By setting the ratio of the sum of the length of the first region and the length of the third region to the overall length of the chirped grating structure at 0.1 or more, the fringes in the reflection spectrum can be further reduced in size. By setting the ratio of the sum of the length of the first region and the length of the third region to the overall length of the chirped grating structure at 0.2 or less, it is possible to broaden the wavelength band in the center region of the reflection spectrum in which reflectivity is substantially flat.

Furthermore, in the semiconductor diffraction grating device according to the present invention, the pitch of the plurality of projections formed in the first region, the second region, and the third region may monotonically increase in the predetermined axis direction. In this case, the chirped grating can be suitably constituted by the plurality of projections.

Furthermore, in the semiconductor diffraction grating device according to the present invention, preferably, the plurality of projections formed in the first region, the second region, and the third region are composed of a first semiconductor; the plurality of projections each extend from the semiconductor core layer toward the semiconductor cladding layer; the plurality of projections are separated from each other; and a second semiconductor is provided between the plurality of projections, the second semiconductor having a different refractive index from the first semiconductor.

Furthermore, preferably, the semiconductor diffraction grating device according to the present invention further includes a plurality of electrodes arranged in the predetermined axis direction on the chirped grating structure.

In this case, by applying a predetermined current or voltage to at least one of the plurality of electrodes, the reflection spectrum of the semiconductor diffraction grating device can be changed to obtain a desired reflection spectrum.

A semiconductor laser according to the present invention includes a semiconductor substrate having a principal surface; a first reflecting section and a second reflecting section provided on the principal surface of the semiconductor substrate, the first reflecting section and the second reflecting section constituting a laser cavity; and a gain section disposed on the principal surface of the semiconductor substrate between the first reflecting section and the second reflecting section, the gain section generating an optical gain. The first reflecting section, the second reflecting section, and the gain section are arranged along the principal surface of the semiconductor substrate. Furthermore, the second reflecting section includes a semiconductor core layer and a semiconductor cladding layer provided on the principal surface of the semiconductor substrate, a chirped grating structure provided between the semiconductor core layer and the semiconductor cladding layer, and a plurality of electrodes arranged in a predetermined axis direction on the chirped grating structure. The chirped grating structure includes a first region, a second region, and a third region arranged in that order in the predetermined axis direction, and the first region, the second region, and the third region include a plurality of projections constituting a chirped grating. The plurality of projections are provided at placement positions arranged with a predetermined pitch in the predetermined axis direction. The coupling coefficient κ of the chirped grating monotonically increases in the predetermined axis direction to a predetermined value in the first region, remains flat in the second region, and monotonically decreases in the predetermined axis direction from the predetermined value in the third region.

In the semiconductor laser according to the present invention, the coupling coefficient κ of the chirped grating in the second reflecting section monotonically increases in the first region, remains flat in the second region, and monotonically decreases in the third region. Consequently, in the second reflecting section, it is possible to achieve a reflection spectrum in which the fringes are reduced in size in the vicinity of the boundaries between the wavelength band having a substantially flat reflectivity and the wavelength bands at both ends thereof. As a result, in the semiconductor laser according to the present invention, it is possible to obtain good laser characteristics in which the influence of fringes is reduced.

DESCRIPTION OF THE PREFERRED
EMBODIMENTS

The findings of the present invention can be easily understood by considering the following detailed description with reference to the attached drawings shown as exemplification. Embodiments of the present invention will now be described with reference to the attached drawings. Where possible, the same components are designated by the same reference numerals.

Figure 1:
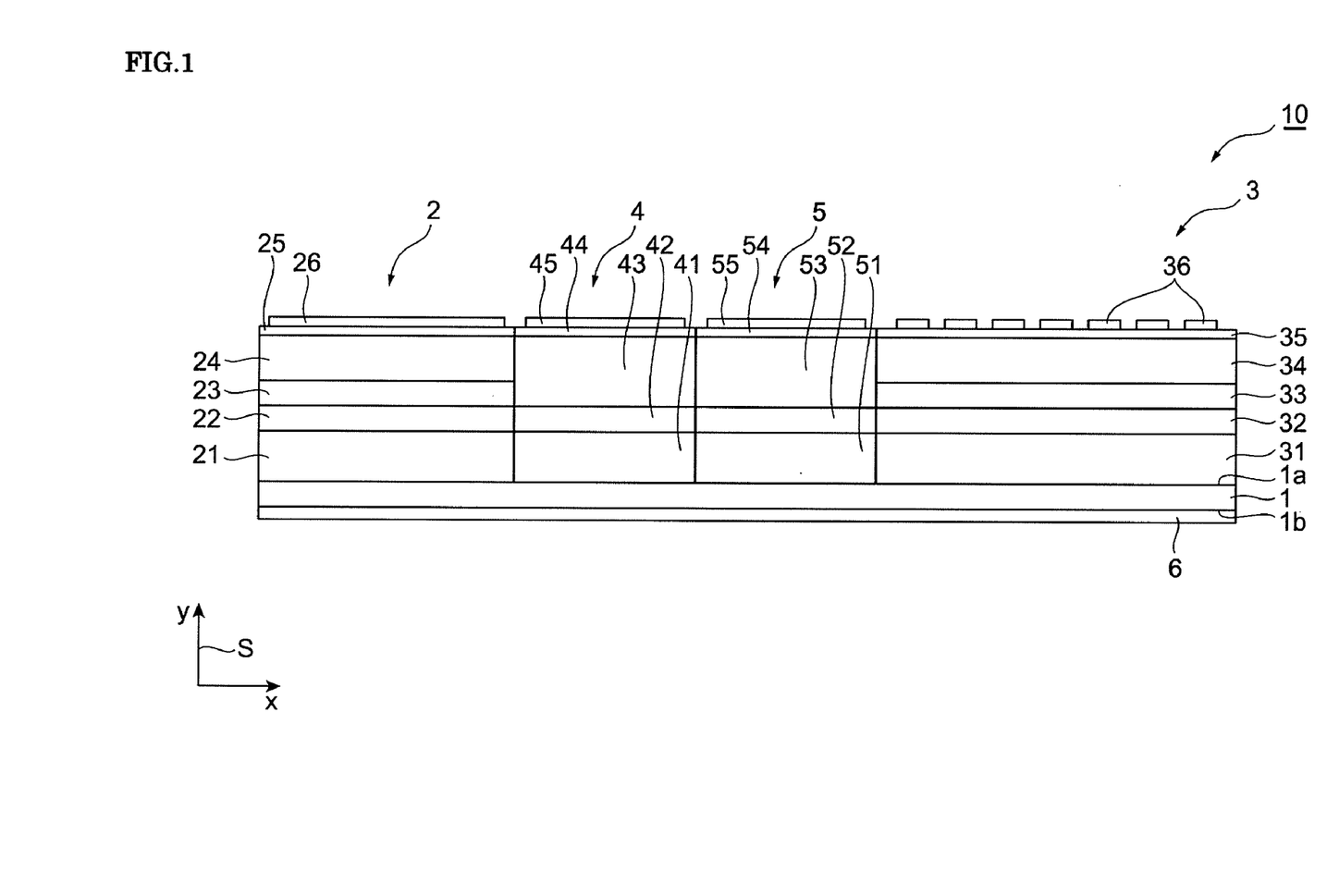
FIG. 1 is a cross-sectional view which schematically shows a structure of a semiconductor laser according to an embodiment.

FIG. 1 is a cross-sectional view which schematically shows a structure of a semiconductor laser according to an embodiment. An orthogonal coordinate system S is shown in FIG. 1. As shown in FIG. 1, a semiconductor laser 10 includes a semiconductor substrate 1. The semiconductor substrate 1 has a principal surface 1a and a back surface 1b. The semiconductor substrate 1 is composed of, for example, a group III-V compound semiconductor. The y-axis of the orthogonal coordinate system S is a coordinate axis extending in a direction orthogonal to the principal surface 1a of the semiconductor substrate 1.

The semiconductor laser 10 includes a first reflecting section 2, a second reflecting section 3, a phase control section 4, a gain section 5, and a back-surface electrode 6. The first reflecting section 2, the phase control section 4, the gain section 5, and the second reflecting section 3 are provided on the principal surface 1a of the semiconductor substrate 1 and arranged in that order in a predetermined axis direction along the principal surface 1a of the semiconductor substrate 1. The predetermined axis is the x-axis of the orthogonal coordinate system S. The phase control section 4 and the gain section 5 are disposed between the first reflecting section 2 and the second reflecting section 3. The first reflecting section 2 and the second reflecting section 3 constitute a laser cavity of the semiconductor laser 10. The semiconductor substrate 1, the back-surface electrode 6, and the second reflecting section 3 constitute a semiconductor diffraction grating device. The back-surface electrode 6 is provided on the back surface 1b of the semiconductor substrate 1. The back-surface electrode 6 is an electrode common to the first reflecting section 2, the second reflecting section 3, the phase control section 4, and the gain section 5. The back-surface electrode 6 can be, for example, composed of AuGe/Ni/Au.

The first reflecting section 2 includes a lower cladding layer 21, a core layer 22, a grating layer 23, an upper cladding layer 24, a contact layer 25, and an electrode 26. The lower cladding layer 21, the core layer 22, the grating layer 23, the upper cladding layer 24, and the contact layer 25 are stacked in that order on the principal surface 1a of the semiconductor substrate 1. The electrode 26 is provided on the contact layer 25. The grating layer 23 includes two semiconductor layers or elements having different refractive indices. Furthermore, the grating layer 23 includes periodic projections and recesses composed of one of the two semiconductor layers or elements having different refractive indices. The diffraction grating constitutes a distributed Bragg reflector. The first reflecting section 2 is used as a reflecting mirror for reflecting light with a predetermined wavelength. The layers in the first reflecting section 2 can each be composed of, for example, a group III-V compound semiconductor. Furthermore, the refractive index of each of the lower cladding layer 21 and the upper cladding layer 24 is lower than the refractive index of the core layer 22.

The second reflecting section 3 includes a lower cladding layer 31, a core layer (semiconductor core layer) 32, a grating layer 33, an upper cladding layer (semiconductor cladding layer) 34, a contact layer 35, and a plurality of electrodes 36. The lower cladding layer 31, the core layer 32, the grating layer 33, the upper cladding layer 34, and the contact layer 35 are stacked in that order on the principal surface 1a of the semiconductor substrate 1. The plurality of electrodes 36 are arranged in the x-axis direction on the contact layer 35. The grating layer 33 includes two semiconductor layers or elements having different refractive indices. Furthermore, the grating layer 33 includes periodic projections and recesses composed of one of the two semiconductor layers or elements having different refractive indices. The second reflecting section 3 is used as a reflecting mirror for reflecting light with a predetermined wavelength. The layers in the second reflecting section 3 can each be composed of, for example, a group III-V compound semiconductor. Furthermore, the refractive index of each of the lower cladding layer 31 and the upper cladding layer 34 is lower than the refractive index of the core layer 32.

The phase control section 4 includes a lower cladding layer 41, a core layer 42, an upper cladding layer 43, a contact layer 44, and an electrode 45. The lower cladding layer 41, the core layer 42, the upper cladding layer 43, and the contact layer 44 are stacked in that order on the principal surface 1a of the semiconductor substrate 1. The electrode 45 is provided on the contact layer 44. In the phase control section 4, the refractive index of the core layer 42 is changed by a signal applied to the electrode 45 to control the phase of light propagating in the core layer 42. As the signal applied to the electrode 45, for example, a voltage signal or a current signal may be used. The layers in the phase control section 4 can each be composed of, for example, a group III-V compound semiconductor.

The gain section 5 includes a lower cladding layer 51, an active layer 52, an upper cladding layer 53, a contact layer 54, and an electrode 55. The lower cladding layer 51, the active layer 52, the upper cladding layer 53, and the contact layer 54 are stacked in that order on the principal surface 1a of the semiconductor substrate 1. The active layer 52 includes, for example, a quantum well (QW) structure. The electrode 55 is provided on the contact layer 54. In the gain section 5, an optical gain is generated by injecting carriers from the electrode 55. The layers in the gain section 5 can each be composed of, for example, a group III-V compound semiconductor.

The core layer 22 in the first reflecting section 2, the core layer 42 in the phase control section 4, the active layer 52 in the gain section 5, and the core layer 32 in the second reflecting section 3 are optically connected to each other.

Figure 2:
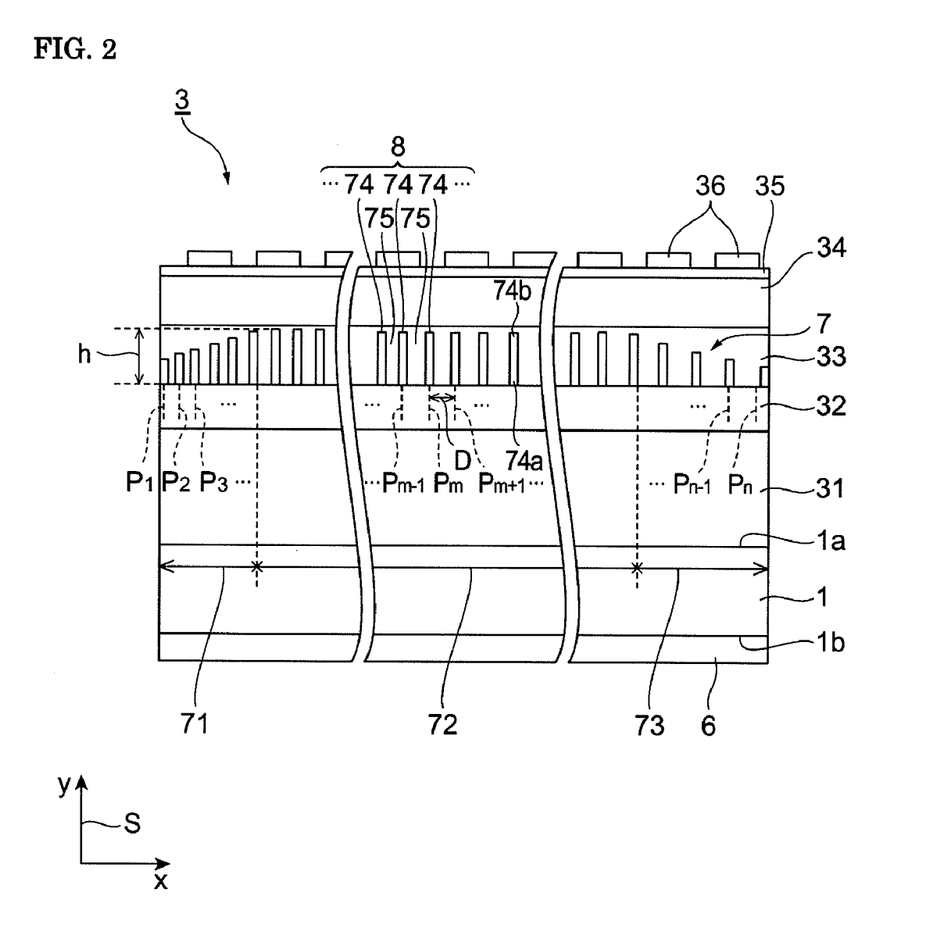
FIG. 2 is an enlarged cross-sectional view which schematically shows a structure of a second reflecting section shown in FIG. 1.

The materials for the components of the semiconductor laser 10 are exemplified as follows:
Semiconductor substrate 1: Si-doped n-type InP
Lower cladding layers 21, 31, 41, and 51: Si-doped n-type InP
Core layers 22, 32, and 42: non-doped GaInAsP
Grating layers 23 and 33: GaInAsP and InP (non-doped or p-type)
  Projection 74 of the grating layer 33: GaInAsP
  Semiconductor portion 75 of the grating layer 33: InP
Upper cladding layers 24, 34, 43, and 53: Zn-doped p-type InP
Contact layers 25, 35, 44, and 54: Zn-doped p-type GaInAs
Active layer 52: QW structure including GaInAsP well layers and GaInAsP barrier layers Next, the second reflecting section 3 will be described in detail with reference to FIG. 2. FIG. 2 is an enlarged cross-sectional view which schematically shows a structure of the second reflecting section 3. An orthogonal coordinate system S is shown in FIG. 2. As shown in FIG. 2, the grating layer 33 has a chirped grating structure 7.

The chirped grating structure 7 includes a first region 71, a second region 72, and a third region 73. The first region 71, the second region 72, and the third region 73 are arranged in that order in the x-axis direction. The chirped grating structure 7 has a plurality of projections 74 in the first region 71, the second region 72, and the third region 73. For example, there are about 180 projections in the first region 71, about 1,100 projections in the second region 72, and about 170 projections in the third region 73.

The plurality of projections 74 are provided in placement positions $P_1$ to $P_n$ arranged in the x-axis direction. The pitch of the plurality of projections 74 corresponds to a distance between the two adjacent placement positions (e.g., a distance D between a placement position $P_m$ and a placement position $P_{m+1}$), and monotonically increases in the x-axis direction. In such a manner, the plurality of projections 74 constitute a chirped grating 8 in which the grating pitch changes in the x-axis direction. Here, the grating pitch is defined as a distance between adjacent projections.

In this embodiment, one end 74a of the projections 74 is connected to the core layer 32. Each of the projections 74 extends from the core layer 32 toward the upper cladding layer 34, but does not reach the upper cladding layer 34. The projections 74 are separated from each other, and a semiconductor portion 75 having a different refractive index from the projections 74 lies between adjacent projections 74. Semiconductor materials constituting the projections 74 and the semiconductor portions 75 can be selected such that the refractive index of the semiconductor portions constituting the projections 74 is higher than the refractive index of the semiconductor portions 75 lying between the projections 74. For example, the projections 74 can be composed of GaInAsP, and the semiconductor portions 75 can be composed of InP.

Figure 3A:
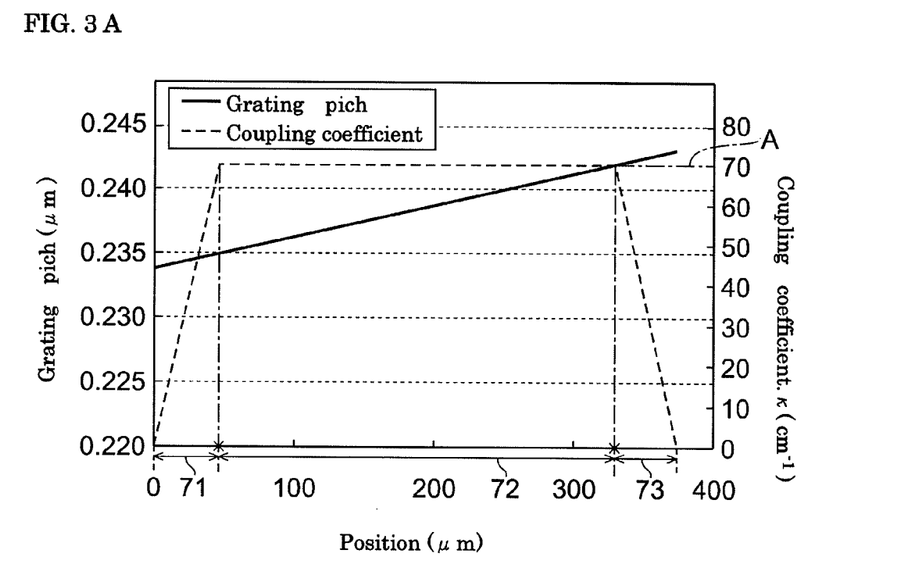
FIG. 3A is a graph showing changes in grating pitch and coupling coefficient in a chirped grating shown in FIG. 2.

The height of the projections 74 in the first region 71 increases monotonically in the x-axis direction to a predetermined height h. The height of the projections 74 in the second region 72 is substantially constant at the predetermined height h. Although the height of the projections 74 in the second region 72 is preferably constant, errors due to production tolerance may be acceptable. The height of the projections 74 in the third region 73 decreases monotonically in the x-axis direction from the predetermined height h. By adjusting the height of the projections 74 in such a manner, the coupling coefficient κ of the chirped grating 8 is changed as shown in FIG. 3A. In other words, the height of the projections 74 in the first region 71, the second region 72, and the third region 73 is adjusted so that the coupling coefficient κ of the chirped grating 8 changes as shown in FIG. 3A.

Here, the coupling coefficient κ is a parameter that indicates the strength of coupling between light propagating in the core layer and the diffraction grating, and the optical power reflectivity R by a diffraction grating with a length L, at the Bragg wavelength, is represented by R=tan h$^2$ (κL).

FIG. 3A is a graph showing the coupling coefficient κ and the grating pitch in the chirped grating 8. In FIG. 3A, the horizontal axis represents the position in the x-axis direction in the chirped grating 8. The left-side vertical axis represents the grating pitch of the chirped grating 8, and the right-side vertical axis represents the coupling coefficient κ of the chirped grating 8. Furthermore, in FIG. 3A, the solid line represents the change in the grating pitch of the chirped grating 8, and the dashed line represents the change in the coupling coefficient κ of the chirped grating 8.

According to FIG. 3A, the grating pitch changes so as to linearly increase in the x-axis direction. The coupling coefficient κ of the chirped grating 8, in the first region 71, monotonically increases in the x-axis direction to a predetermined value A (70 cm$^{-1}$ in the example shown in FIG. 3A). Specifically, the change in the coupling coefficient κ in the first region 71 is defined by the error function, and the coupling coefficient κ increases monotonically and nonlinearly in the x-axis direction to the predetermined value A. Furthermore, the coupling coefficient κ remains flat (constant at the predetermined value A) in the second region 72, and the coupling coefficient κ monotonically decreases in the x-axis direction from the predetermined value A in the third region 73. Specifically, the change in the coupling coefficient κ in the third region 73 is defined by the error function, and the coupling coefficient κ decreases monotonically and nonlinearly in the x-axis direction from the predetermined value A.

In addition, the definition of the change in the coupling coefficient κ in each of the first region 71 and the third region 73 is not limited to the error function, and the change may be defined by a function that monotonically changes, such as the linear function. Furthermore, the definition of the change in the coupling coefficient κ in each of the first region 71 and the third region 73 is not limited to the function described above, and the change may be defined by the step function, the piecewise linear function, or the like.

Figure 3B:
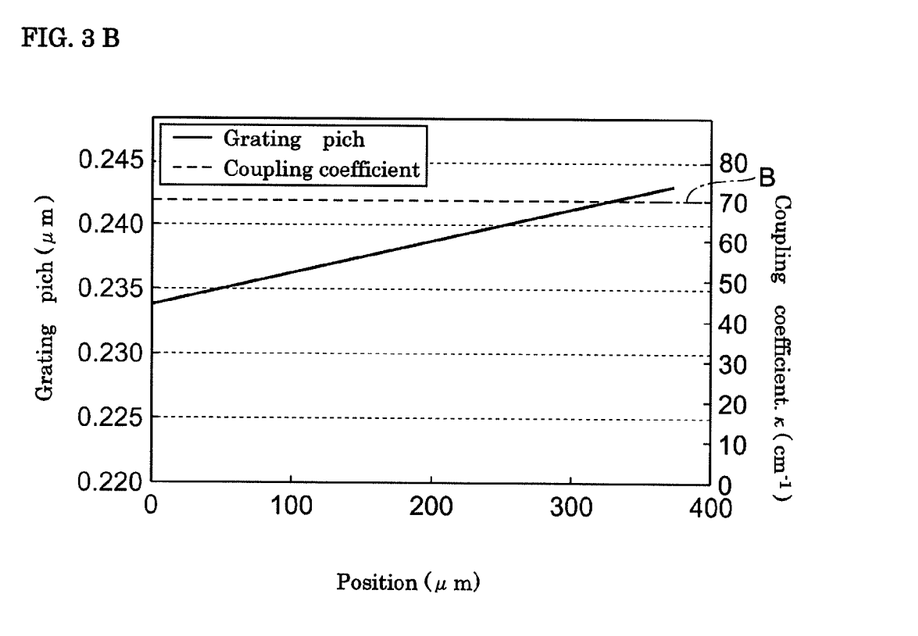
FIG. 3B is a graph showing changes in grating pitch and coupling coefficient in a known chirped grating.

FIG. 3B is a graph showing the coupling coefficient κ and the grating pitch in a known chirped grating. In FIG. 3B, the horizontal axis represents the position in the x-axis direction in the chirped grating. The left-side vertical axis represents the grating pitch of the chirped grating, and the right-side vertical axis represents the coupling coefficient κ of the chirped grating. Furthermore, in FIG. 3B, the solid line represents the change in the grating pitch of the chirped grating, and the dashed line represents the change in the coupling coefficient κ of the chirped grating.

Figure 4A:
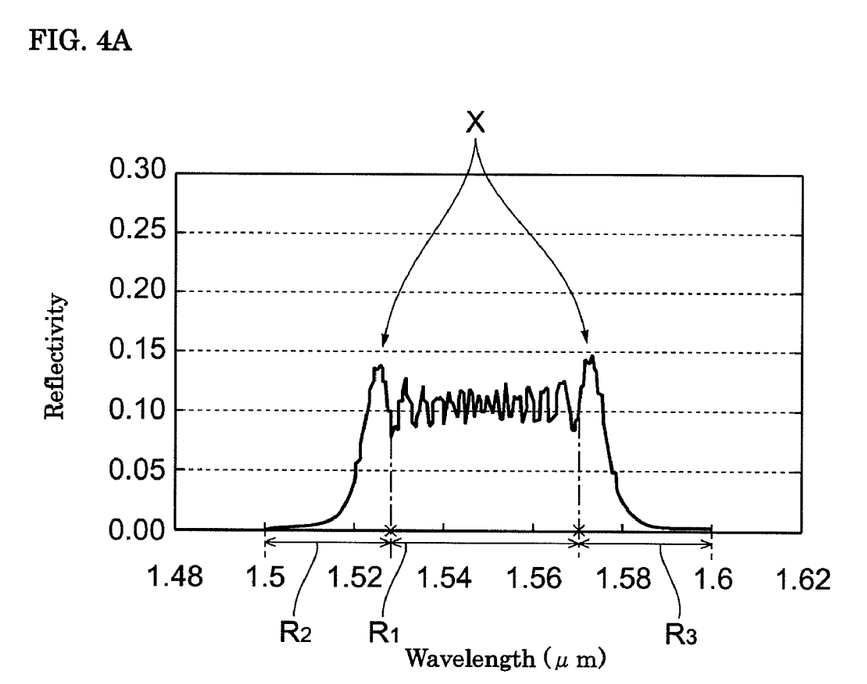
FIG. 4A is a graph showing a reflection spectrum of the known chirped grating.

In the known chirped grating, as shown in FIG. 3B, the grating pitch increases monotonically with the increase in the position, and the coupling coefficient κ is constant at a predetermined value B (70 cm$^{-1}$). The reflection spectrum of such a known chirped grating is shown in FIG. 4A. The reflection spectrum of the chirped grating 8 according to this embodiment is shown in FIG. 4B.

Figure 4B:
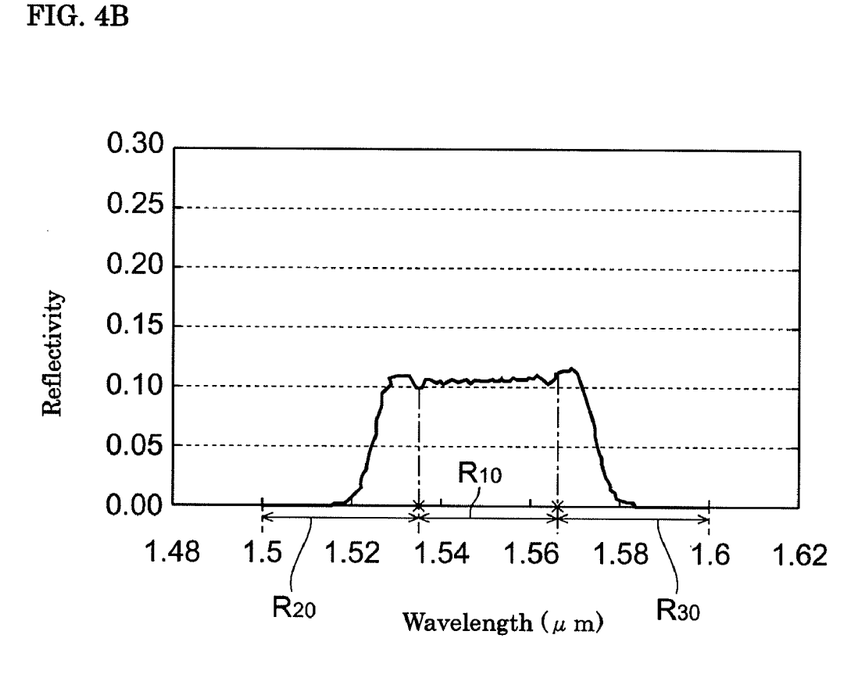
FIG. 4B is a graph showing a reflection spectrum of the chirped grating shown in FIG. 2.

FIG. 4A is a graph showing the reflection spectrum of the known chirped grating, and FIG. 4B is a graph showing the reflection spectrum of the chirped grating 8 according to this embodiment. In FIGS. 4A and 4B, the horizontal axis represents the wavelength, and the vertical axis represents the reflectivity. As shown in FIG. 4A, the reflection spectrum of the known chirped grating has relatively large fringes X in the vicinity of the boundaries between the wavelength band $R_1$ in the center region and the wavelength bands $R_2$ and $R_3$ at both ends of the reflection spectrum. In contrast, as shown in FIG. 4B, the reflection spectrum of the chirped grading 8 according to this embodiment has a wavelength band $R_{10}$ in which the reflectivity is substantially flat, and the fringes are reduced in size or no fringes occur in the vicinity of the boundaries between the wavelength band $R_{10}$ and the wavelength bands $R_{20}$ and $R_{30}$ at both ends of the reflection spectrum.

The reason for this reflection spectrum of the chirped grading 8 is that the coupling coefficient κ of the chirped grating 8 remains flat in the second region 72, monotonically increases in the x-axis direction to the predetermined value A in the first region 71, and monotonically decreases in the x-axis direction from the predetermined value A in the third region 73. Here, as one example, the overall length $L_T$ of the chirped grating 8 is set at 374 μm, and the sum $L_A$ of the length of the first region 71 and the length of the third region 73 is set at 44 μm. Note that the first region 71 and the third region 73 are each a region in which the coupling coefficient κ is changed in the x-axis direction. Hereinafter, the first region 71 and the third region 73 are referred to as "apodized regions". For example, the coupling coefficient κ can be set so as to change according to a function defined by the error function with respect to the position x. In this case, since the overall length $L_T$ of the chirped grating 8 is 374 μm and the length $L_A$ of the apodized regions is 44 μm, the ratio of the length of the apodized regions to the overall length of the chirped grating 8 ($L_A/L_T$) is about 11.8%.

By applying a current or voltage to at least one of the plurality of electrodes 36, a change in the refractive index can be induced in a corresponding area of the grating layer 33. Thus, the reflection spectrum of the chirped grating 8 can be changed. Next, the reflection spectrum of the chirped grating 8 in applying a current or voltage to at least one of the plurality of electrodes 36 will be described with reference to FIGS. 5A and 5B.

Figure 5A:
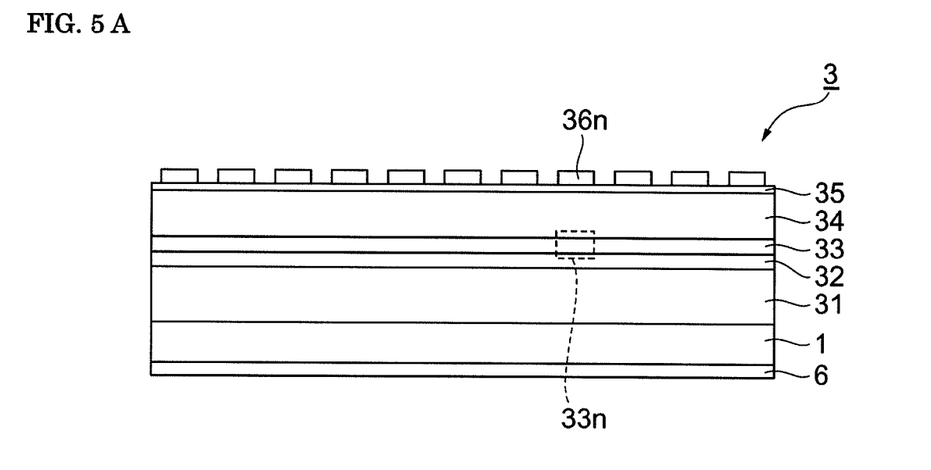
FIG. 5A is an explanatory view showing application of current or voltage to at least one of a plurality of electrodes in the second reflecting section shown in FIG. 1.
Figure 5B:
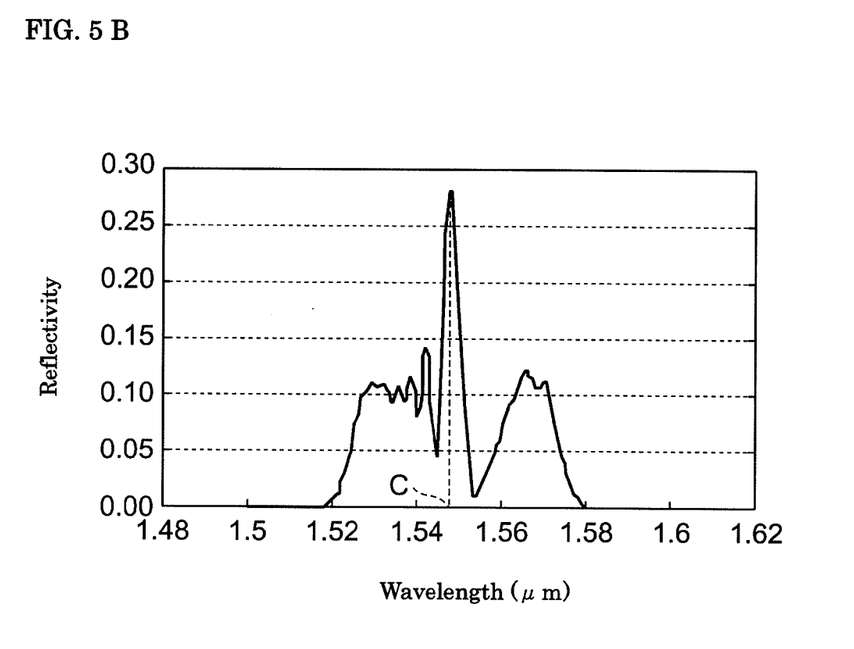
FIG. 5B is a graph showing a change of a reflection spectrum of the chirped grading shown in FIG. 2.

As shown in FIG. 5A, by injecting a current, for example, to the nth electrode $36_n$ among the plurality of electrodes 36 in the second reflecting section 3, the refractive index is changed in a corresponding area $33_n$ of the grating layer 33. Then, the wavelength reflected by the chirped grating 8 in the area $33_n$ is shifted, for example, to a short-wavelength side. As a result, the reflection spectrum of the chirped grating 8 has a peak at a specific wavelength C as shown in FIG. 5B. Since the chirped grading 8 has the reflection spectrum in which fringes are reduced in size as shown in FIG. 4B, the ratio of the reflectivity of the peak wavelength C to that of other wavelengths increases. Therefore, selectivity between the peak wavelength C and other wavelengths is improved. Consequently, in the semiconductor laser 10 according to this embodiment, it is possible to obtain good laser characteristics in which the influence of fringes is reduced.

Figure 6:
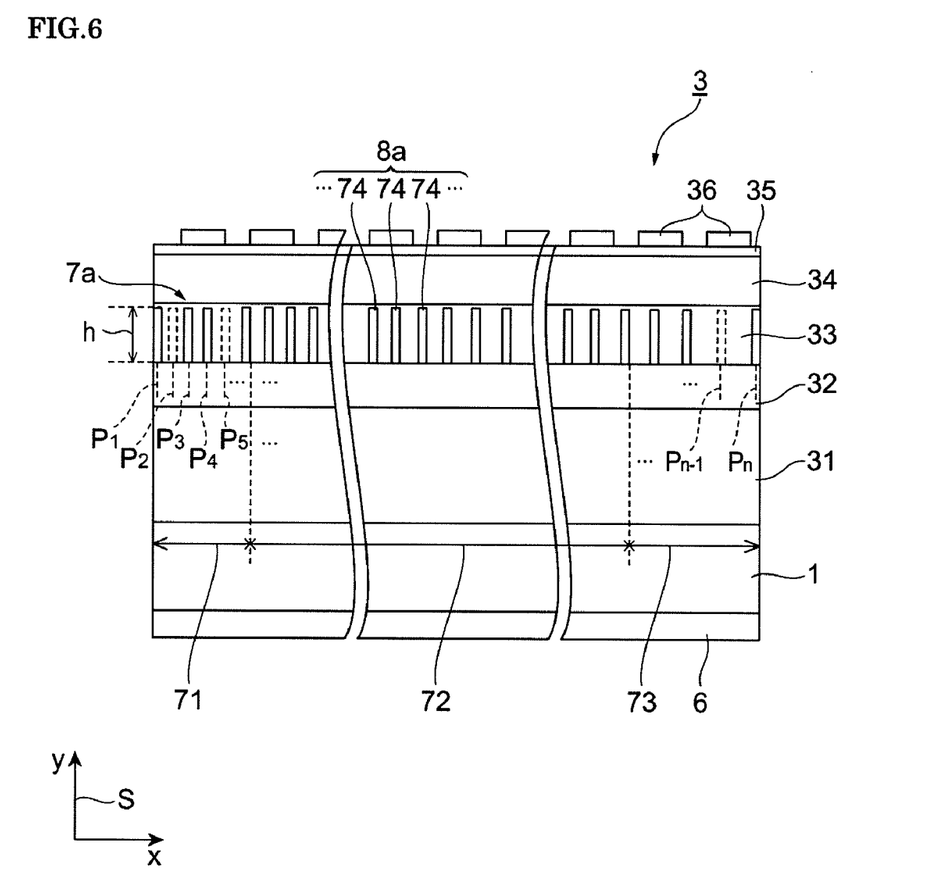
FIG. 6 is a cross-sectional view which shows a structure of the chirped grating structure shown in FIG. 2 according to another embodiment.

FIG. 6 shows a chirped grating structure 7a as another example of the chirped grating structure 7. In the chirped grating structure 7a, a chirped grating 8a is constituted by adjusting the number of projections 74 in the first region 71 and the third region 73, in which the coupling coefficient κ changes as shown in FIG. 3A.

In the chirped grating structure 7a, at least one position (e.g., placement position $P_2$ and placement position $P_5$) among the placement positions in the first region 71 is not provided with a projection 74, and at least one position (e.g., placement position $P_{n-1}$) among the placement positions in the third region 73 is not provided with a projection 74. That is, in the chirped grating 8a of the chirped grating structure 7a, predetermined projections 74 among the plurality of projections 74 in the first region 71 and the third region 73 are removed. By adjusting the number of projections 74 (i.e., thinning the projections 74) in the first region 71 and the third region 73 in such a manner, it is possible to constitute a chirped grating 8a in which the coupling coefficient κ changes as shown in FIG. 3A. In addition, the number of projections 74 to be removed in the first region 71 is, for example, about 90, and the number of projections 74 to be removed in the third region 73 is, for example, about 85. Furthermore, all the placement positions in the second region 72 are provided with projections 74 (i.e., the projections 74 in the second region 72 are not thinned). Meanwhile, the height of projections 74 is substantially constant at a predetermined height h over the first region 71, the second region 72, and the third region 73. Consequently, since the change in the coupling coefficient ic in the first and third regions is adjusted by not providing projections at predetermined positions, the device can be easily fabricated in comparison with the case where projections are provided over the entire region of the chirped grating and the height of projections is changed in each of the first region and the third region.

Preferably, the placement positions not provided with projections 74 in each of the first region 71 and the third region 73 are selected in a random manner from the array of placement positions $P_1$ to $P_n$. That is, preferably, the placement positions not provided with projections 74 in each of the first region 71 and the third region 73 are not periodic in the array of placement positions $P_1$ to $P_n$. More specifically, preferably, the placement positions not provided with projections 74 are selected, for example, on the basis of the result obtained by multiplying a desired coupling coefficient ic by a predetermined random number (i.e., the placement positions not provided with projections 74 are selected in a random manner) to change the coupling coefficient κ as shown in FIG. 3A. On the other hand, for example, in the first region 71, it is not preferable that the placement positions not provided with projections 74 are selected in a regular manner, for example, at $P_1$, $P_3$, $P_5$, $P_7$ . . . . .

In addition, in order to more suitably achieve the change in the coupling coefficient κ as shown in FIG. 3A, in the first region 71, preferably, the placement positions not provided with projections 74 are selected such that the number of projections 74 per unit length (number density) decreases from the boundary between the first region 71 and the second region 72 toward the end of the first region 71. For the same reason, in the third region 73, preferably, the placement positions not provided with projections 74 are selected such that the number of projections 74 per unit length decreases from the boundary between the third region 73 and the second region 72 toward the end of the third region 73.

Figure 7:
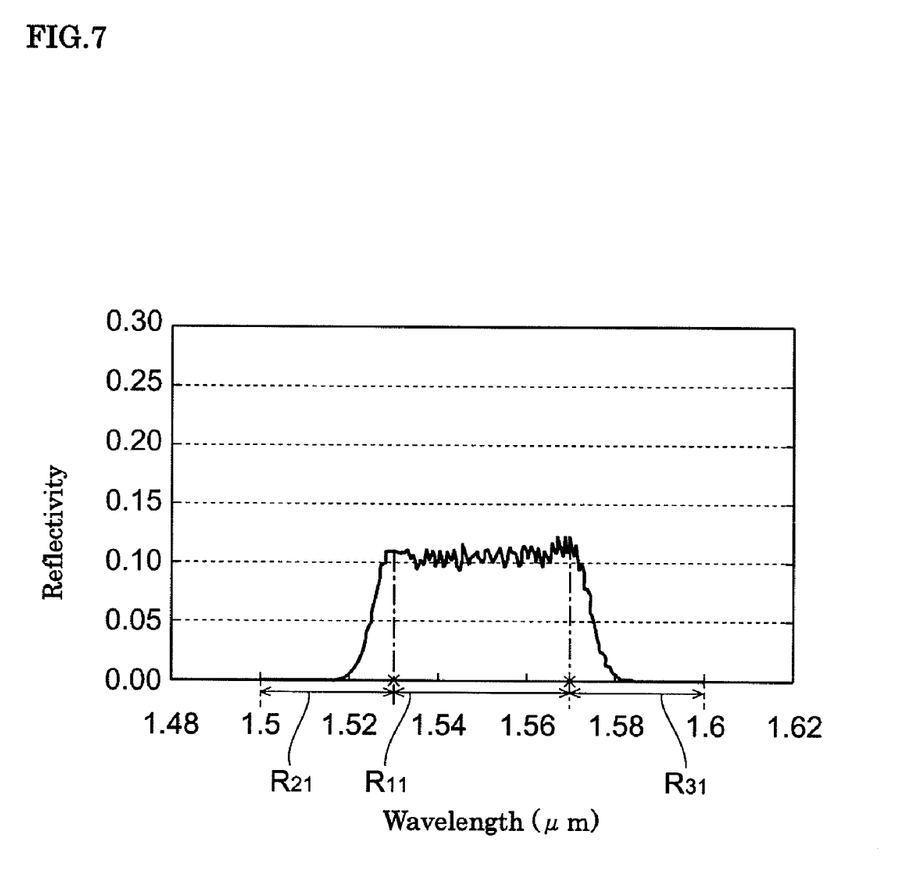
FIG. 7 is a graph showing a reflection spectrum of a chirped grating shown in FIG. 6.

The reflection spectrum of the chirped grating 8a constituted by projections 74, the number of which is adjusted in the manner described above, is shown in FIG. 7. FIG. 7 is a graph showing the reflection spectrum of the chirped grating 8a. In FIG. 7, the horizontal axis represents the wavelength, and the vertical axis represents the reflectivity. As shown in FIG. 7, the reflection spectrum of the chirped grading 8a has a wavelength band $R_{11}$ in which the reflectivity is substantially flat. Furthermore, when compared with the reflection spectrum of the known chirped grating shown in FIG. 4A, in the reflection spectrum of the chirped grating 8a, the fringes are reduced in size in the vicinity of the boundaries between the wavelength band $R_{11}$ in which the reflectivity is substantially flat and the wavelength bands $R_{21}$ and $R_{31}$ at both ends. In particular, large changes in reflectivity due to the regularity of thinning of projections 74 are suppressed.

Figure 8A:
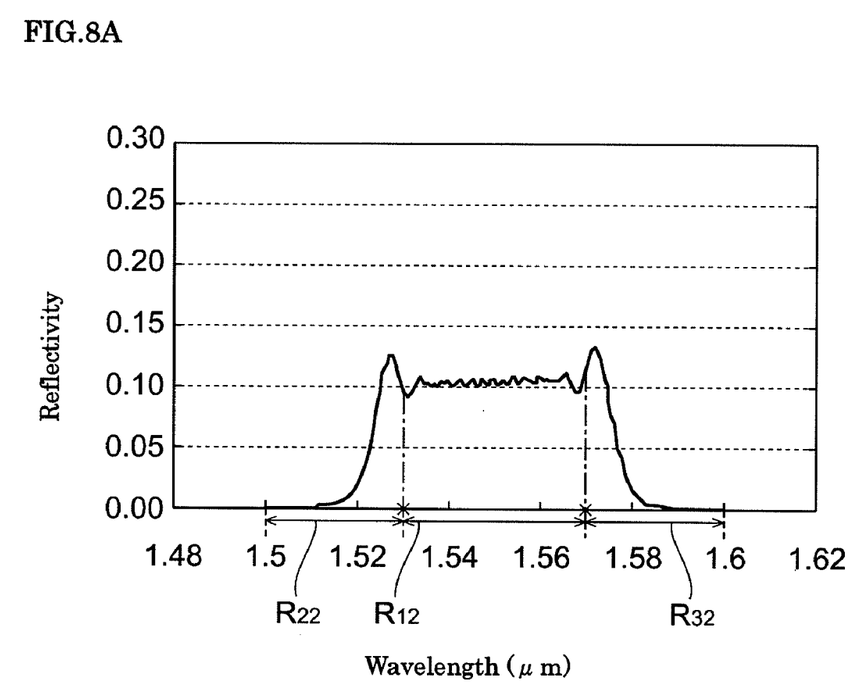
FIGS. 8A and 8B are each a graph showing a reflection spectrum of a modification example of the chirped grating shown in FIG. 2.
Figure 8B:
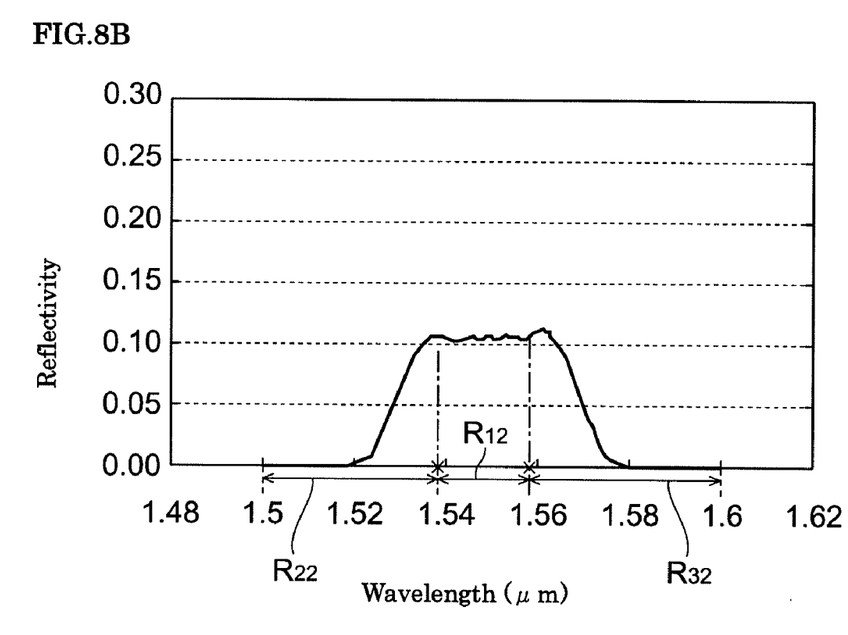

Meanwhile, the ratio of the length $L_A$ of the apodized regions to the overall length $L_T$ of the chirped grating 8 may be changed. FIG. 8A shows the reflection spectrum of the chirped grating 8 in which the overall length $L_T$ of the chirped grating 8 is 374 μm and the length $L_A$ of the apodized regions is 22 μm. In this case, the ratio of the length $L_A$ of the apodized regions to the overall length $L_T$ of the chirped grating 8 is about 5.9%. Furthermore, FIG. 8B shows the reflection spectrum of the chirped grating 8 in which the overall length $L_T$ of the chirped grating 8 is 374 μm and the length $L_A$ of the apodized regions is 88 μm. In this case, the ratio of the length $L_A$ of the apodized regions to the overall length $L_T$ of the chirped grating 8 is about 23.5%.

In FIGS. 8A and 8B, the horizontal axis represents the wavelength, and the vertical axis represents the reflectivity. According to the reflection spectra shown in FIGS. 8A and 8B, in the chirped grating 8 in which the ratio of the length $L_A$ of the apodized regions to the overall length $L_T$ of the chirped grating 8 is about 5.9%, the wavelength band $R_{12}$ in the center region in which the reflectivity is substantially flat is wide compared with the chirped grating 8 in which the ratio of the length $L_A$ of the apodized regions to the overall length $L_T$ of the chirped grating 8 is about 23.5%. Meanwhile, in the chirped grating 8 in which the ratio of the length $L_A$ of the apodized regions to the overall length $L_T$ of the chirped grating 8 is about 23.5%, the fringes are reduced in size in the vicinity of the boundaries between the wavelength band $R_{12}$ and the wavelength bands $R_{22}$ and $R_{32}$ at both ends compared with the chirped grating 8 in which the ratio of the length $L_A$ of the apodized regions to the overall length $L_T$ of the chirped grating 8 is about 5.9%.

In each of the chirped grating 8 in which the ratio of the length $L_A$ of the apodized regions to the overall length $L_T$ of the chirped grating 8 is about 5.9% (FIG. 8A), the chirped grating 8 in which the ratio of the length $L_A$ of the apodized regions to the overall length $L_T$ of the chirped grating 8 is about 11.8% (FIG. 4B), and the chirped grating 8 in which the ratio of the length $L_A$ of the apodized regions to the overall length $L_T$ of the chirped grating 8 is about 23.5% (FIG. 8B), as shown in FIGS. 4B, 8A, and 8B, fringes are sufficiently reduced in size compared with the reflection spectrum of the known chirped grating shown in FIG. 4A. In order to more suitably reduce the fringes in size, the ratio of the length $L_A$ of the apodized regions to the overall length $L_T$ of the chirped grating 8 is more preferably set at about 10% or more. Furthermore, in order to broaden the wavelength band in the center region in which the reflectivity is substantially flat, the ratio of the length $L_A$ of the apodized regions to the overall length $L_T$ of the chirped grating 8 is more preferably set at about 20% or less.

In the embodiment described above, the grating pitch of the chirped grating 8 linearly changes. However, the grating pitch is not limited thereto. For example, the grating pitch of the chirped grating 8 may be changed stepwise on the basis of the step function, or may be changed on the basis of any nonlinear function.

Furthermore, in the embodiment described above, the projections 74 are separated from each other. However, the projections 74 are not limited thereto. For example, a connecting member for connecting one ends 74a of the projections 74 to each other may be provided on the core layer 32. In this case, the one ends 74a of the projections 74 are connected by the connecting member, and the other ends 74b are separated from each other. The connecting member is composed of the same material as that of the projections 74. That is, instead of the arrangement of the projections 74 that are separated from each other, a layer structure having projections and recesses on the surface thereof may be used.

Furthermore, in the embodiment described above, the grating layers 23 and 33 are disposed between the core layer 22 and the upper cladding layer 24 and between the core layer 32 and the upper cladding layer 34, respectively. However, the grating layers 23 and 33 may be disposed, for example, between the lower cladding layer 21 and the core layer 22 and between the lower cladding layer 31 and the core layer 32, respectively.

While the principle of the present invention has been illustrated and described above in the preferred embodiments of the invention, it will be appreciated by those skilled in the art that the present invention may be varied in detail without departing from the principle. Therefore, all the modifications and alterations within the scope of the claims or the spirit of the invention are to be construed as being covered by the claims.

What is claimed is:

1. A semiconductor diffraction grating device comprising:
   a semiconductor substrate having a principal surface;
   a semiconductor core layer and a semiconductor cladding layer provided on the principal surface of the semiconductor substrate; and
   a chirped grating structure provided between the semiconductor core layer and the semiconductor cladding layer, the chirped grating structure having a first end and a second end opposite to the first end and having a changing coupling coefficient, κ, wherein
   the chirped grating structure includes a first region, a second region, and a third region arranged in that order in a predetermined axis direction, the first region, the second region, and the third region each including a plurality of projections constituting a chirped grating;
   the plurality of projections are provided at placement positions arranged with a predetermined pitch in the predetermined axis direction, the pitch of the projections changing monotonically from the first end to the second end of the chirped grating structure; and
   the first region has a coupling coefficient κ increasing monotonically from the first end of the chirped grating structure to the second region in the predetermined axis direction, the second region has a constant coupling coefficient κ of a predetermined value, and the third region has a coupling coefficient κ decreasing monotonically from the second region to the second end of the chirped grating structure in the predetermined axis direction.

2. The semiconductor diffraction grating device according to claim 1, wherein the projections in the first region have heights increasing monotonically from the first chirped grating structure end to the second region in the predetermined axis direction, and the projections in the third region have heights decreasing monotonically from the second region to the second chirped grating structure end in the predetermined axis direction.

3. The semiconductor diffraction grating device according to claim 1, wherein at least one placement position in the first region is not provided with a projection, and at least one placement position in the third region is not provided with a projection.

4. The semiconductor diffraction grating device according to claim 3, wherein the placement positions not provided with the projections in the first region are not periodic in the array of placement positions for the plurality of projections, and the placement positions not provided with the projections in the third region are not periodic in the array of placement positions for the plurality of projections.

5. The semiconductor diffraction grating device according to claim 3, wherein the plurality of projections formed in the first region, the second region, and the third region have a substantially constant height over the first region, the second region, and the third region.

6. The semiconductor diffraction grating device according to claim 1, wherein the ratio of the sum of the length of the first region and the length of the third region to the overall length of the chirped grating structure is greater than or equal to 0.1 and smaller than or equal to 0.2.

7. The semiconductor diffraction grating device according to claim 1, wherein the plurality of projections formed in the first region, the second region, and the third region are composed of a first semiconductor; the plurality of projections each extend from the semiconductor core layer toward the semiconductor cladding layer; the plurality of projections are separated from each other; and a second semiconductor is provided between the plurality of projections, the second semiconductor having a different refractive index from the first semiconductor.

8. The semiconductor diffraction grating device according to claim 1, further comprising a plurality of electrodes arranged in the predetermined axis direction on the chirped grating structure.

9. A semiconductor laser comprising:
   a semiconductor substrate having a principal surface;
   a first reflecting section and a second reflecting section provided on the principal surface of the semiconductor substrate, the first reflecting section and the second reflecting section constituting a laser cavity; and
   a gain section disposed on the principal surface of the semiconductor substrate between the first reflecting section and the second reflecting section, the gain section generating an optical gain, wherein
   the first reflecting section, the second reflecting section, and the gain section are arranged along the principal surface of the semiconductor substrate;
   the second reflecting section includes a semiconductor core layer and a semiconductor cladding layer provided on the principal surface of the semiconductor substrate, a chirped grating structure provided between the semiconductor core layer and the semiconductor cladding layer, and a plurality of electrodes arranged in a predetermined axis direction on the chirped grating structure;
   the chirped grating structure has a first end and a second end opposite to the first end;
   the chirped grating structure has a changing coupling coefficient, κ;
   the chirped grating structure includes a first region, a second region, and a third region arranged in that order in the predetermined axis direction, the first region, the second region, and the third region each including a plurality of projections constituting a chirped grating;
   the plurality of projections are provided at placement positions arranged with a predetermined pitch in the predetermined axis direction, the pitch of the projections changing monotonically from the first end of the chirped grating structure to the second end of the chirped grating structure; and
   the first region has a coupling coefficient κ increasing monotonically from the first end of the chirped grating structure to the second region in the predetermined axis direction, the second region has a constant coupling coefficient κ of a predetermined value, and the third region has a coupling coefficient κ decreasing monotonically from the second region to the second end of the chirped grating structure in the predetermined axis direction.

10. The semiconductor laser according to claim 9, wherein the projections in the first region have heights increasing monotonically from the first chirped grating structure end to the second region in the predetermined axis direction, and the projections in the third region have heights decreasing monotonically from the second region to the second chirped grating structure end in the predetermined axis direction.

11. The semiconductor laser according to claim 9, wherein at least one placement position in the first region is not provided with a projection, and at least one placement position in the third region is not provided with a projection.

12. The semiconductor diffraction grating device according to claim 1, wherein the coupling coefficient κ of the first region increases monotonically from zero to the predetermined value, and the coupling coefficient κ of the third region decreases monotonically from the predetermined value to zero.

* * * * *